US012180830B2

United States Patent
Chen et al.

(10) Patent No.: US 12,180,830 B2
(45) Date of Patent: Dec. 31, 2024

(54) DETERMINING AN UPTAKE CAPACITY OF A CORE SAMPLE

(71) Applicant: Saudi Arabian Oil Company, Dhahran (SA)

(72) Inventors: Jin-Hong Chen, Katy, TX (US); Stacey M. Althaus, Houston, TX (US); John David Broyles, Houston, TX (US); Houzhu Zhang, Houston, TX (US); Younane N. Abousleiman, Norman, OK (US)

(73) Assignee: Saudi Arabian Oil Company, Dhahran (SA)

( * ) Notice: Subject to any disclaimer, the term of this patent is extended or adjusted under 35 U.S.C. 154(b) by 142 days.

(21) Appl. No.: 18/163,089

(22) Filed: Feb. 1, 2023

(65) Prior Publication Data
US 2024/0254878 A1    Aug. 1, 2024

(51) Int. Cl.
  *G01R 33/46*    (2006.01)
  *E21B 49/08*    (2006.01)
  *G01N 24/08*    (2006.01)

(52) U.S. Cl.
  CPC ......... *E21B 49/088* (2013.01); *G01N 24/081* (2013.01); *G01R 33/4625* (2013.01)

(58) Field of Classification Search
  CPC .. E21B 49/088; G01N 24/081; G01R 33/4625
  See application file for complete search history.

(56) References Cited

U.S. PATENT DOCUMENTS

| 2020/0363352 A1 | 11/2020 | King et al. | |
| 2024/0003838 A1* | 1/2024 | Althaus | G01N 33/241 |
| 2024/0027378 A1* | 1/2024 | Chen | G01N 33/24 |

OTHER PUBLICATIONS

Abragam, "The Principles of Nuclear Magnetism," Oxford University Press, 1961, Chapter 1, 1 page.
Brandani et al., "Net, Excess and Absolute Adsorption and Adsorption of Helium," Adsorption, Feb. 2016, 22:261-276, 16 pages.
Chen et al., "Capillary Condensation and NMR Relaxation Time in Unconventional Shale Hydrocarbon Resources," presented at the SPWLA 53rd Annual Logging Symposium, Catagena, Colombia, Jun. 16-20, 2012, 9 pages.

(Continued)

*Primary Examiner* — G. M. A Hyder
(74) *Attorney, Agent, or Firm* — Fish & Richardson P.C.

(57) ABSTRACT

Techniques for determining an uptake capacity of a core sample include measuring a nuclear magnetic resonance (NMR) spectrum signal of a test fluid at a particular pressure and entrained in a core sample enclosed in a test cylinder of an NMR pressure cell such that an annulus is defined between the core sample and the test cylinder; deconvolving the NMR spectrum signal into a first NMR spectrum signal portion that is associated with a first portion of the test fluid in the annulus and a second NMR spectrum signal portion that is associated with a second portion of the test fluid entrained in the core sample; and determining a mass of the second portion of the test fluid based at least in part on the first and second NMR spectrum signals.

34 Claims, 5 Drawing Sheets

(56) References Cited

OTHER PUBLICATIONS

Loucks et al., "Morphology, Genesis, and Distribution of Nanometer-Scale Pores in Siliceous Mudstones of the Mississippian Barnett Shale," Journal of Sedimentary Research, 2009, 79:848-861, 14 pages.
Mengal et al., "Accounting For Adsorbed Gas in Shale Gas Reservoirs," presented at the SPE Middle East Oil and Gas Show and Conference, Manama, Bahrain, Sep. 25-28, 2011, 15 pages.
Sing et al., "Reporting Physisorption Data for Gas/Solid Systems with Special Reference to the Determination of Surface Area and Porosity," Pure & Applied Chemistry, 57(4), 1985, 603-619, 17 pages.
Thommes et al., "Physisorption of gases, with special reference to the evaluation of surface area and pore size distribution (IUPAC Technical Report)," Pure and Applied Chemistry, 87(9-10), Jul. 2015, 1051-1069, 19 pages.
Thommes et al., "Physical adsorption characterization of nanoporous materials: progress and challenges," Adsorption, Feb. 2014, 20:233-250, 18 pages.
Veselinovic et al., "Measurement of Natural Gas Isotherms and Imaging Gas in Shale Using NMR," Unconventional Resources Technology Conference, Jul. 2018, 8 pages.
Wang et al., "A review of common practices in gravimetric and volumetric adsorption kinetic experiments," Adsorption, 27, Nov. 2020, 295-318, 24 pages.
Zhang et al., "Effect of organic-matter type and thermal maturity on methane adsorption in shale-gas systems," Organic Geochemistry, Apr. 2012, 47:120-131, 12 pages.

* cited by examiner

DETERMINING AN UPTAKE CAPACITY OF A CORE SAMPLE

TECHNICAL FIELD

The present disclosure describes systems and methods for determining an uptake capacity of a core sample.

BACKGROUND

An amount of fluid that is able to be injected into a porous core sample gives information on the pore space and fluid storage capacity of the core sample. Conventional measurement methods largely include two types of measurements: volumetric methods and gravimetric methods. Most of these methods use a small amount of the core sample in powder form, and the change in volume/weight is then monitored as an indirect method to measure fluid uptake. The configuration and maintenance of these systems are crucial for valid measurement, however, many conventional systems do not undergo a rigorous testing needed.

SUMMARY

In an example implementation, a method for determining an uptake capacity of a core sample includes measuring a nuclear magnetic resonance (NMR) spectrum signal of a test fluid at a particular pressure and entrained in a core sample enclosed in a test cylinder of an NMR pressure cell such that an annulus is defined between the core sample and the test cylinder; deconvolving the NMR spectrum signal into a first NMR spectrum signal portion that is associated with a first portion of the test fluid in the annulus and a second NMR spectrum signal portion that is associated with a second portion of the test fluid entrained in the core sample; and determining a mass of the second portion of the test fluid based at least in part on the first and second NMR spectrum signals.

In an aspect combinable with the example implementation, the particular pressure is less than about 1000 psi.

Another aspect combinable with any of the previous aspects further includes determining a ratio of first and second NMR spin magnetizations from the respective first and second NMR spectrum signals; and determining a radial dimension of the test cylinder, a radial dimension of the core sample, a distance between NMR coil contacts of an NMR coil of the NMR pressure cell, a mass of the core sample, and a bulk density of the test fluid.

In another aspect combinable with any of the previous aspects, determining the ratio of first and second NMR spin magnetizations includes determining the first NMR spin magnetization by integrating the first NMR spectrum signal; and determining the second NMR spin magnetization by integrating the second NMR spectrum signal.

In another aspect combinable with any of the previous aspects, determining the mass of the second portion of the test fluid based at least in part on the first and second NMR spectrum signals includes determining the mass of the second portion of the test fluid based on the radial dimension of the test cylinder, the radial dimension of the core sample, a length of the core sample, the bulk density of the test fluid, and the ratio of the first and second NMR spin magnetizations.

In another aspect combinable with any of the previous aspects, determining the mass of the second portion of the test fluid based on the radial dimension of the test cylinder, the radial dimension of the core sample, a length of the core sample, the bulk density of the test fluid, and the ratio of the first and second NMR spectrum signals includes solving for $$m_{pf} = \pi l \frac{(R^2 - r^2)\rho}{\gamma},$$

where $m_{pf}$ is the mass of the second portion of the test fluid, l is the length of the core sample, R is the radial dimension of the test cylinder, r is the radial dimension of the core sample, $\rho$ is the bulk density of the test fluid, and $\gamma$ is the ratio of the first and second NMR spin magnetizations.

Another aspect combinable with any of the previous aspects further includes determining a test fluid mass per core sample mass by dividing the mass of the second portion of the test fluid by the mass of the core sample.

In another aspect combinable with any of the previous aspects, the particular pressure is more than about 1000 psi.

Another aspect combinable with any of the previous aspects further includes determining a real NMR spectrum of the test fluid in the annulus and the core sample by integrating the NMR spectrum signal over a resonance frequency; determining a transverse relaxation time modulated NMR spectrum using a spin-echo pulse sequence; and determining an NMR spectrum difference by subtracting the transverse relaxation time modulated NMR spectrum from the real NMR spectrum.

In another aspect combinable with any of the previous aspects, deconvolving the NMR spectrum signal into the first NMR spectrum signal portion that is associated with the first portion of the test fluid in the annulus and the second NMR spectrum signal portion that is associated with the second portion of the test fluid entrained in the core sample includes deconvolving the NMR spectrum difference into the first NMR spectrum signal portion and the second NMR spectrum signal portion.

Another aspect combinable with any of the previous aspects further includes determining a ratio of first and second NMR spin magnetizations from the respective first and second NMR spectrum signals; and determining a radial dimension of the test cylinder, a radial dimension of the core sample, a distance between NMR coil contacts of an NMR coil of the NMR pressure cell, a mass of the core sample, and a bulk density of the test fluid.

In another aspect combinable with any of the previous aspects, determining the ratio of first and second NMR spin magnetizations includes determining the first NMR spin magnetization by integrating the first NMR spectrum signal; and determining the second NMR spin magnetization by integrating the second NMR spectrum signal.

In another aspect combinable with any of the previous aspects, determining the mass of the second portion of the test fluid based at least in part on the first and second NMR spectrum signals includes determining the mass of the second portion of the test fluid based on the radial dimension of the test cylinder, the radial dimension of the core sample, a length of the core sample, the bulk density of the test fluid, and the ratio of the first and second NMR spin magnetizations.

In another aspect combinable with any of the previous aspects, determining the mass of the second portion of the test fluid based on the radial dimension of the test cylinder, the radial dimension of the core sample, a length of the core sample, the bulk density of the test fluid, and the ratio of the first and second NMR spectrum signals includes solving for $$m_{pf} = \pi l \frac{(R^2 - r^2)\rho}{\gamma},$$

where $m_{pf}$ is the mass of the second portion of the test fluid, l is the length of the core sample, R is the radial dimension of the test cylinder, r is the radial dimension of the core sample, $\rho$ is the bulk density of the test fluid, and $\gamma$ is the ratio of the first and second NMR spin magnetizations.

Another aspect combinable with any of the previous aspects further includes determining a test fluid mass per core sample mass by dividing the mass of the second portion of the test fluid by the mass of the core sample.

In another aspect combinable with any of the previous aspects, the test fluid includes carbon dioxide ($CO_2$).

In another aspect combinable with any of the previous aspects, the $CO_2$ includes $^{13}C$ labeled $CO_2$.

In another example implementation, a system for determining an uptake capacity of a core sample includes a nuclear magnetic resonance (NMR) pressure cell that includes a test cylinder configured to hold a test fluid and a core sample; and an NMR coil positioned around the test cylinder and configured to measure NMR spectrum signals of the test cylinder. The system further includes a control system communicably coupled to the NMR coil and configured to perform operations including measuring a nuclear magnetic resonance (NMR) spectrum signal of a test fluid at a particular pressure and entrained in a core sample enclosed in a test cylinder of an NMR pressure cell such that an annulus is defined between the core sample and the test cylinder; deconvolving the NMR spectrum signal into a first NMR spectrum signal portion that is associated with a first portion of the test fluid in the annulus and a second NMR spectrum signal portion that is associated with a second portion of the test fluid entrained in the core sample; and determining a mass of the second portion of the test fluid based at least in part on the first and second NMR spectrum signals.

In an aspect combinable with the example implementation, the particular pressure is less than about 1000 psi.

In another aspect combinable with any of the previous aspects, the operations further include determining a ratio of first and second NMR spin magnetizations from the respective first and second NMR spectrum signals; and determining a radial dimension of the test cylinder, a radial dimension of the core sample, a distance between NMR coil contacts of an NMR coil of the NMR pressure cell, a mass of the core sample, and a bulk density of the test fluid.

In another aspect combinable with any of the previous aspects, the operation of determining the ratio of first and second NMR spin magnetizations includes determining the first NMR spin magnetization by integrating the first NMR spectrum signal; and determining the second NMR spin magnetization by integrating the second NMR spectrum signal.

In another aspect combinable with any of the previous aspects, the operation of determining the mass of the second portion of the test fluid based at least in part on the first and second NMR spectrum signals includes determining the mass of the second portion of the test fluid based on the radial dimension of the test cylinder, the radial dimension of the core sample, a length of the core sample, the bulk density of the test fluid, and the ratio of the first and second NMR spin magnetizations.

In another aspect combinable with any of the previous aspects, the operation of determining the mass of the second portion of the test fluid based on the radial dimension of the test cylinder, the radial dimension of the core sample, a length of the core sample, the bulk density of the test fluid, and the ratio of the first and second NMR spectrum signals includes solving for $$m_{pf} = \pi l \frac{(R^2 - r^2)\rho}{\gamma},$$

where $m_{pf}$ is the mass of the second portion of the test fluid, l is the length of the core sample, R is the radial dimension of the test cylinder, r is the radial dimension of the core sample, $\rho$ is the bulk density of the test fluid, and $\gamma$ is the ratio of the first and second NMR spin magnetizations.

In another aspect combinable with any of the previous aspects, the operations further include determining a test fluid mass per core sample mass by dividing the mass of the second portion of the test fluid by the mass of the core sample.

In another aspect combinable with any of the previous aspects, the particular pressure is more than about 1000 psi.

In another aspect combinable with any of the previous aspects, the operation further include determining a real NMR spectrum of the test fluid in the annulus and the core sample by integrating the NMR spectrum signal over a resonance frequency; determining a transverse relaxation time modulated NMR spectrum using a spin-echo pulse sequence; and determining an NMR spectrum difference by subtracting the transverse relaxation time modulated NMR spectrum from the real NMR spectrum.

In another aspect combinable with any of the previous aspects, the operation of deconvolving the NMR spectrum signal into the first NMR spectrum signal portion that is associated with the first portion of the test fluid in the annulus and the second NMR spectrum signal portion that is associated with the second portion of the test fluid entrained in the core sample includes deconvolving the NMR spectrum difference into the first NMR spectrum signal portion and the second NMR spectrum signal portion.

In another aspect combinable with any of the previous aspects, the operation further include determining a ratio of first and second NMR spin magnetizations from the respective first and second NMR spectrum signals; and determining a radial dimension of the test cylinder, a radial dimension of the core sample, a distance between NMR coil contacts of an NMR coil of the NMR pressure cell, a mass of the core sample, and a bulk density of the test fluid.

In another aspect combinable with any of the previous aspects, the operation of determining the ratio of first and second NMR spin magnetizations includes determining the first NMR spin magnetization by integrating the first NMR spectrum signal; and determining the second NMR spin magnetization by integrating the second NMR spectrum signal.

In another aspect combinable with any of the previous aspects, the operation of determining the mass of the second portion of the test fluid based at least in part on the first and second NMR spectrum signals includes determining the mass of the second portion of the test fluid based on the radial dimension of the test cylinder, the radial dimension of the core sample, a length of the core sample, the bulk density of the test fluid, and the ratio of the first and second NMR spin magnetizations.

In another aspect combinable with any of the previous aspects, the operation of determining the mass of the second portion of the test fluid based on the radial dimension of the test cylinder, the radial dimension of the core sample, a length of the core sample, the bulk density of the test fluid, and the ratio of the first and second NMR spectrum signals includes solving for $$m_{pf} = \pi l \frac{(R^2 - r^2)\rho}{\gamma},$$

where $m_{pf}$ is the mass of the second portion of the test fluid, l is the length of the core sample, R is the radial dimension of the test cylinder, r is the radial dimension of the core sample, $\rho$ is the bulk density of the test fluid, and $\gamma$ is the ratio of the first and second NMR spin magnetizations.

In another aspect combinable with any of the previous aspects, the operation further include determining a test fluid mass per core sample mass by dividing the mass of the second portion of the test fluid by the mass of the core sample.

In another aspect combinable with any of the previous aspects, the test fluid includes carbon dioxide ($CO_2$).

In another aspect combinable with any of the previous aspects, the $CO_2$ includes $^{13}C$ labeled $CO_2$.

Implementations of systems and methods for determining an uptake capacity of a core sample according to the present disclosure can include one, some, or all of the following features. For example, systems and methods for determining an uptake capacity of a core sample according to the present disclosure can include directly measuring a total test fluid in a porous system, in contrast to obtaining excess adsorption according to convention methods. As another example, systems and methods for determining an uptake capacity of a core sample according to the present disclosure can include using a core sample that is an intact natural sample rather than a particulate sample (for example, drill cuttings or crushed pieces). As another example, systems and methods for determining an uptake capacity of a core sample according to the present disclosure can include the use of test fluids that occupy only part of the pores in a core sample. Further, examples of systems and methods for determining an uptake capacity of a core sample do not require pretreatment of the core sample and is non-destructive to the core sample.

The details of one or more implementations of the subject matter described in this disclosure are set forth in the accompanying drawings and the description below. Other features, aspects, and advantages of the subject matter will become apparent from the description, the drawings, and the claims.

DETAILED DESCRIPTION

Figure 1:
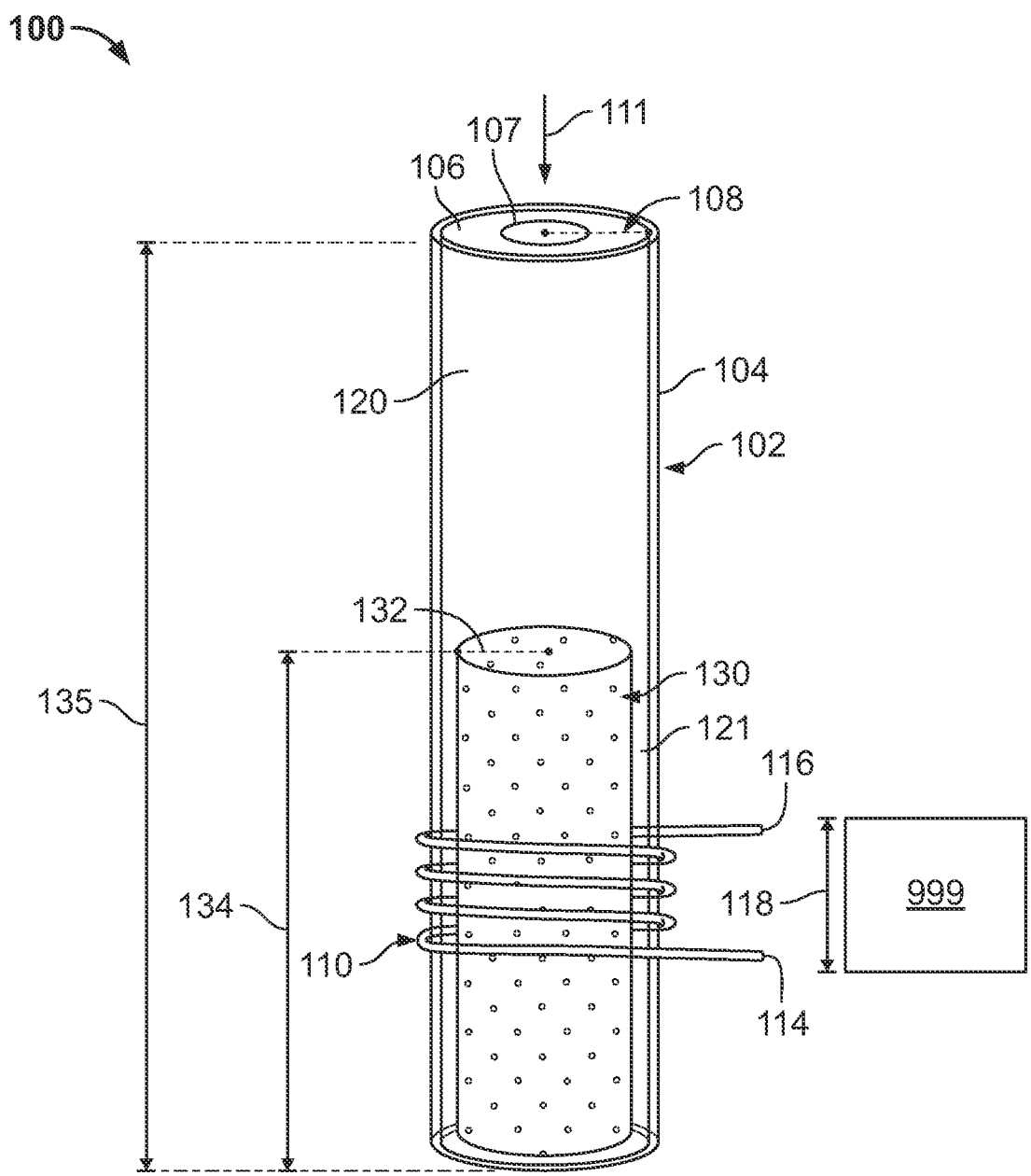
FIG. 1 is a schematic drawing of a rock property measurement system as used in sequential steps in an example method for determining an uptake capacity of a rock core sample according to the present disclosure.

FIG. 1 is a schematic drawings of a rock property measurement system 100 as used in sequential steps in an example method for determining an uptake capacity of a rock core sample 130 (also called core sample 130) according to the present disclosure. Generally, rock property measurement system 100 can be used according to an example testing method (described with reference to this figure) to measure, for example, a mass of fluid in a cylindrically-shaped core sample 130 that has a substantially circular axial cross-sectional shape and a particular length (as shown in FIG. 1). In some aspects, the system 100 can be used to accurately determine gas in the core sample 130 at high pressure as well. Thus, in rock property measurement system 100 and the example method, the core sample 130 can be tested for fluid uptake properties without crushing the core sample into powder. In some aspects, the rock property measurement system 100 can be or include a high pressure nuclear magnetic resonance (NMR), non-magnetic, test cell (for example, that uses zirconia and stainless steel). In an example implementation, the test cell can be high pressure NMR cell by Daedalus Innovations LLC.

As described in more detail herein, the rock property measurement system 100 can use NMR measurements to directly measure nuclei in a test fluid within the system 100, thereby directly measuring the mass of fluid in the sample 130. By using core sample 130 rather than crushing a core sample into particulate or powder, the possibility of added error from an increased surface area of the powder, or any other effects that may occur from physical alteration of the sample, can be reduced or eliminated. Moreover, by using core sample 130 rather than crushing a core sample into particulate or powder, the core sample 130 can be used for repeated tests and further measurements. In some aspects, the core sample 130 is a type of shale rock.

In some aspects, the rock property measurement system 100 can be used in the in the measurement of fluid mass of reservoir rocks, such as unconventional source rocks. In some aspects, the rock property measurement system 100 can be used to measure a carbon dioxide ($CO_2$) storage capacity of a reservoir rock formation under the terranean surface (whether on land or under a body of water). Such measurements can be advantageous as regulatory regimes may require more $CO_2$ sequestration in subterranean formations.

In other aspects, the rock property measurement system 100 can also be used to determine an amount of hydrocarbon (for example, oil, gas, mixed-phase fluid) that can be stored in the core sample 130, and thus a subterranean formation. Such measurements can be used to determine an initial maximum producible hydrocarbon from the core sample and from the subterranean formation.

As shown in FIG. 1, the rock property measurement system 100 includes a test container 102 (also called a test cylinder or NMR pressure test cell) that is comprised of a cylinder 104 that defines an inner volume 106 into which a core sample 130 can be inserted (for example, through an open end 105). The cylinder 104 has a particular radius 108 of the inner volume 106 (as well as a height 135) that is sufficient to hold a core sample of a particular size, such as a core sample of about 3.40 millimeters (mm) in diameter and 40 mm in length. Thus, in this example the cylinder 104 can have a diameter of about 3.58 mm. The aforementioned dimensions, however, are exemplary and other dimensions of the cylinder 104 and a core sample can vary according to other example implementations. The core sample 130 can be cylindrical or substantially cylindrical in this example of the system 100. The core sample 130 can have a length 134 and a radius 132. When inserted into the inner volume 106, an annulus 121 (for example, a ring shaped volume) between the core sample 130 and the cylinder 104 is created.

As further shown in FIG. 1, an NMR coil 110 is positioned around the cylinder 104 (or conversely, the cylinder 104 is positioned within loops 112 of the NMR coil 110). Thus, in this example, the combination of the test container 102 and NMR coil 110 comprises an NMR pressure cell 102. The NMR coil 110 includes contacts 114 and 116 that are separated by a length (or height) 118, which is a distance of a sensitive zone of detection of the NMR coil 110. While the NMR pressure cell 102 in this example includes the cylinder 104, other container shapes (and core sample shapes) can be used without departing from the scope of this disclosure.

The rock property measurement system 100 can be used to implement an example method for determining a fluid mass in a core sample. For example, the example method can determine an injected fluid quantity for a core sample (or other regularly shaped porous core samples in which a bulk volume of the sample can be easily determined from the shape and size) using NMR measurements. Generally, the example method includes subjecting a pressure injection of a fluid into a core sample, which can facilitate the determination of the mass of fluid in the sample (and also gas in the core sample at high pressure).

To accomplish this, the method utilizing system 100 can include the collection of NMR spectra that are test fluid-dependent in combination with parameters related to the size of the core sample and the NMR pressure cell 102. For example, one or more deconvolution schemes on acquired NMR spectrum can be used to separate NMR signals from an annulus and from inside the rock.

As shown in FIG. 1, an NMR control system 999 is communicably coupled to the NMR coil 110 in order to operate the coil 110 and collect NMR spectra, as well as perform one or more calculations to determine the fluid mass. In some aspects, the NMR control system 999 comprises a mechanical controller or an electro-mechanical controller. In some aspects, the NMR control system 999 can be a microprocessor-based controller. The NMR control system 999 can be used for the operations described in association with any of the computer-implemented methods described previously. The NMR control system 999, in these aspects, is intended to include various forms of digital computing hardware. Generally, the NMR control system 999 can include one or more processors, one or more memory components, and, in some aspects, an input/output device.

As shown in FIG. 1, the rock property measurement system 100 is prepared for the example method. For example, as shown in FIG. 1, the cylinder 104 is initially emptied of a test fluid 111 and the core sample 130 is inserted into the inner volume 106. Next, the test fluid 111 is inserted through injection port 107 into the inner volume 106 at a particular pressure. In this example, the test fluid 111 can be $^{13}C$ labeled $CO_2$, in other words, $^{13}C$ enriched $CO_2$. $^{13}C$ is an isotope of $^{12}C$ and has a natural abundance of only 1.1%. In $^{13}C$ labeled $CO_2$, 100% of the carbon in the test fluid 111 is $^{13}C$. In some aspects, a particular time delay is implemented after filling the cylinder 104 with the test fluid 111 in order to allow a proper diffusion of the test fluid 111 into the pores of the core sample 130, as well as the annulus 121. Other test fluids, such as methane ($CH_4$) or conventional $CO_2$ can be used.

Figure 2:
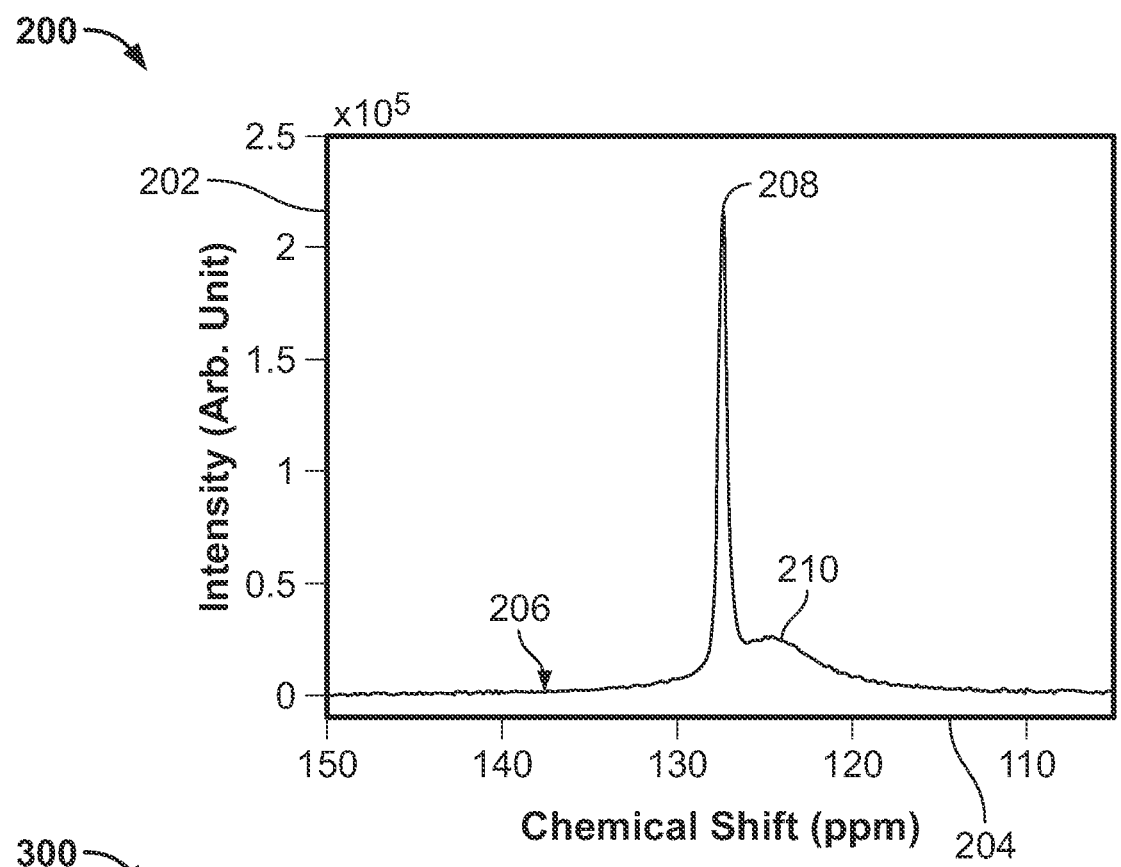
FIGS. 2-7 show graphs of measurements taken or determined during the example method performed by the system of FIG. 1 for determining an uptake capacity of a rock core sample according to the present disclosure.

The test fluid 111 can be injected into the empty inner volume 106 at a particular pressure. Once enclosed, the NMR coil 110 is operated (for example, by the NMR control system 999) to collect NMR spectra of the test fluid 111 (within the core sample 130 and annulus 121) at a particular pressure (for example, 500 psi) and temperature (for example, 40° C.). Turning briefly to FIG. 2, this figure shows a graph 200 of the NMR spectra of the test fluid 111 in the core sample 130 and annulus 121 taken on a 500 MHz NMR spectrometer. Graph 200 includes an x-axis 204 that represents a chemical shift (in parts per million, ppm) while a y-axis 202 represents the intensity of the spectra of fluid in the detection zone of the cylinder 104. A curve 206, as shown, represents the amplitude signal, S, of the NMR spectra of the test fluid 111 in the core sample 130 and annulus 121. A sharp peak 208 represents an intensity of the $CO_2$ spectra in the annulus 121, while a broad peak 210 represents an intensity of the $CO_2$ spectra in the core sample 130.

Figure 3:
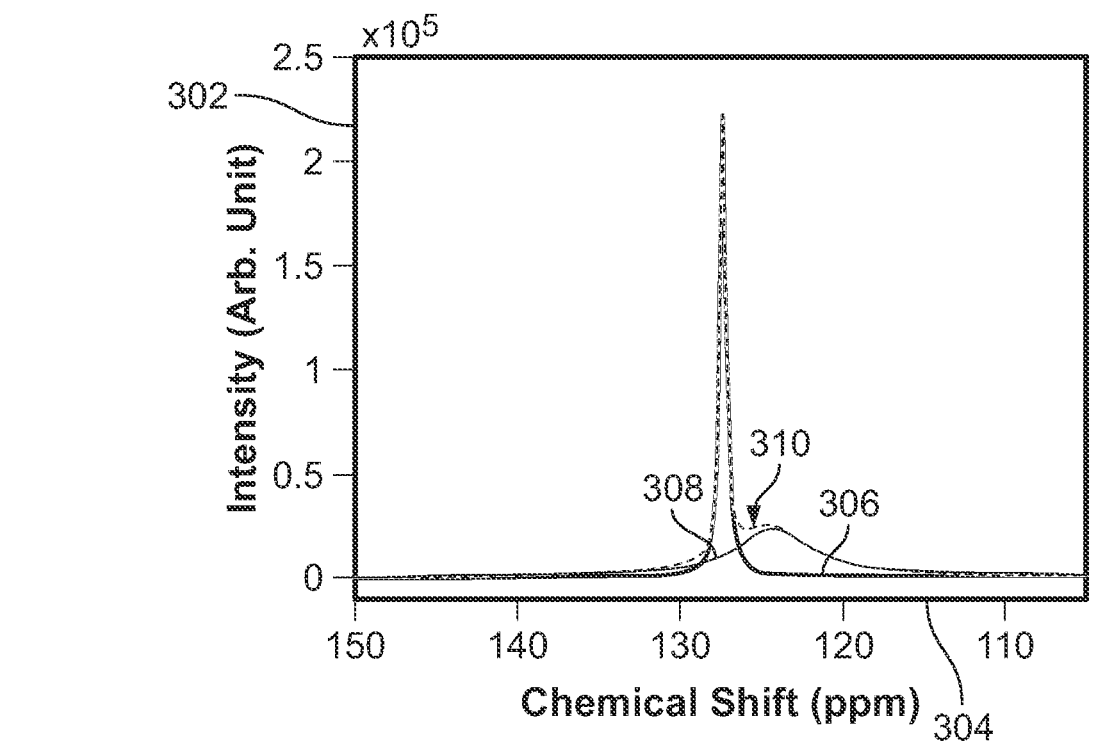

Once the intensity of the $CO_2$ spectra in the annulus 121 and the intensity of the $CO_2$ spectra in the core sample 130, the NMR spectrum (curve 206) can be deconvolved (for example, by an NMR software on system 999 or MATLab) to obtain the two peaks 208 and 210 shown in graph 200. In the present disclosure, "deconvolution" can refer to the decomposition of an NMR spectrum into its separate, additive peak components. FIG. 3 shows a graph 300 of the NMR spectra of the test fluid 111 in the core sample 130 and annulus 121 with deconvolved curves that include the peaks 208 or 210. Graph 300 includes an x-axis 304 that represents a chemical shift (in parts per million, ppm) while a y-axis 302 represents the intensity of the spectra of fluid in the detection zone of the cylinder 104. The curve 310 represents a summation of the two peaks 208 and 210 that is consistent with the acquired NMR spectrum of curve 206. Curve 306 represents an integral of the NMR spectrum, $M_0^{an}$, that gives the spin magnetization of $CO_2$ in the annulus 121, while curve 308 represents an integral of the NMR spectrum, $M_0^{plug}$, that gives the spin magnetization of $CO_2$ in the core sample 130 (in other words, the plug). The NMR spin magnetization is proportional to the number of spins and thus is proportional to the mass for the same molecule (in this case, $CO_2$).

The ratio of these two signals, $M_0^{an}$ and $M_0^{plug}$, can be defined as:

$$\gamma = \frac{M_o^{an}}{M_o^{plug}}. \qquad \text{Eq. 1}$$

The ratio of these signals is also related to parameters of the core sample 130 rock property measurement system 100 and can be calculated as:

$$\frac{M_o^{an}}{M_o^{plug}} = \frac{\pi(R^2 - r^2)A\rho}{\pi r^2 A\phi\rho_p}. \qquad \text{Eq. 2}$$

In Eq. 2, $\rho$ is the bulk density of the test fluid 111 at a given pressure and temperature (which can be determined, for example, by literature, and in this example, is $CO_2$ at 500 psi and 40° C.), $\rho_p$ is an average density of pore fluid (in this example, $CO_2$) in the core sample 130, R is the radius 108, r is the radius 132, $\phi$ is the porosity of the core sample 130, and A is the height 118 of the sensitive zone. In some aspects, because of surface adsorption and nanopore effects, $\rho_p$ can be quite different from $\rho$.

Eqs. 1 and 2 can be combined and simplified to:

$$\phi \rho_p = \frac{(R^2 - r^2)\rho}{r^2 \gamma}.\qquad \text{Eq. 3}$$

In Eq. 3, the values of R and r are known (or can be measured). Considering the full core sample 130, the total injected pore-fluid mass in the sample 130 is then:

$$m_{pf} = \pi r^2 l \phi \rho_p.\qquad \text{Eq. 4}$$

In Eq. 4, l is the length 134 of the core sample 130. Inserting Eq. 3 into Eq. 4 yields:

$$m_{pf} = \pi l \frac{(R^2 - r^2)\rho}{\gamma}.\qquad \text{Eq. 5}$$

The total mass, $m_p$, of the core sample 130 can be measured and the pore-fluid mass in unit plug mass is then:

$$\frac{m_{pf}}{m_p} = \frac{\pi l (R^2 - r^2)\rho}{\gamma m_p}.\qquad \text{Eq. 6}$$

In this example of the system 100 and core sample 130, R=1.88 mm, r=1.705 mm, l=48.73 mm, ρ=69.57 kg/m3, $m_p$=1017.15 mg, and measured γ=0.71 from the deconvolution of the spectrum of graph 300 (the determined ratio from the peaks 208 and 210). Then, the amount of $CO_2$ in the core sample 130 can be calculated as 8.41 mg/g of the sample 130 at 500 psi and 40° C.

This described example method of using the system 100 to determine a mass of the test fluid 111 in the core sample 130 is a "low pressure" example method. In the present disclosure, "low pressure" can refer to a test fluid pressure of below about 1000 psi, while "high pressure" can refer to a test fluid pressure of above about 1000 psi. However, a separation point of low pressure and high pressure can be different depending on, for example, a size of the core sample 130, the fluid type, and/or parameters of the test cylinder 102. In the present disclosure, "about" can refer to plus or minus 1%, 3%, 5%, 10%, or other percentage.

In some aspects, at a high pressure, the test fluid 111 in the annulus 121 can overwhelm the NMR signal from the core sample 130 and make deconvolution more difficult and the measurement error large. Thus, the present disclosure also describes an example method to accurately determine gas in the core sample 130 using a transverse relaxation time filter at high pressure.

For example, the high pressure example method can include acquiring an NMR spectrum in a time domain, also called free-induction-decay (FID). This spectrum can be acquired after a simple 90° degree pulse to excite the nuclear spins, and can be represented (in Eq. 7, below) as:

$$M(t) = M_0^{plug} \exp\left[(i\omega^{plug} - 1/T_2^{plug})t\right] + M_0^{an} \exp\left[(i\omega^{an} - 1/T_2^{an})t\right]\qquad \text{Eq. 7}$$

In Eq. 7, $M_0$ is spin magnetization, ω is resonance frequency, and $T_2$ is transverse relaxation time. The NMR spectrum is a Fourier Transform of the FID in Eq. 7, and the real part of the spectrum is denoted as:

$$S(\omega) = M_0^{plug} \frac{1/T_2^{plug}}{(\omega - \omega^{plug})^2 + (1/T_2^{plug})^2} + M_0^{an} \frac{1/T_2^{an}}{(\omega - \omega^{an})^2 + (1/T_2^{an})^2}.\qquad \text{Eq. 8}$$

The integration of the whole spectrum over the frequency gives the total spin magnetization:

$$\int_{-\infty}^{\infty} S(\omega) d\omega = M_0^{plug} + M_0^{an}.\qquad \text{Eq. 9}$$

Figure 4:
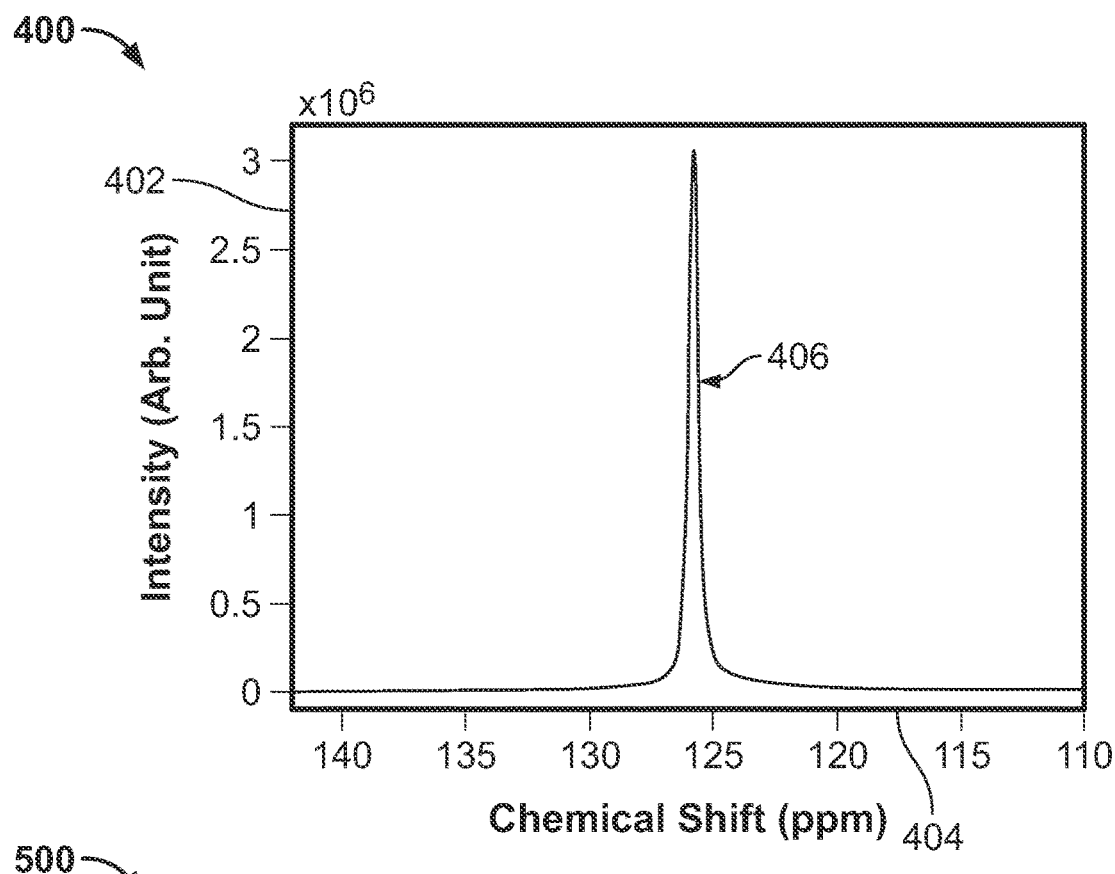

FIG. 4 shows a graph 400 of acquired NMR spectra of the test fluid 111 (in this case, $^{13}C$ labeled $CO_2$) in the core sample 130 and annulus 121 at a high pressure of 4000 psi and a temperature of 40° C. Graph 400 includes an x-axis 404 that represents a chemical shift (in parts per million, ppm) while a y-axis 402 represents the intensity of the spectra of fluid in the detection zone of the cylinder 104. Curve 406 shows the acquired NMR spectrum and shows that the total contribution of the test fluid 111 in the core sample 130 is much smaller than from the annulus 121 (namely, because there is little to no "broad peak" as compared to curve 206) and this deconvolution of the spectrum to obtain the two components can generate significant error.

In order to resolve the deconvolution, a transverse relaxation time modulated spectrum using a spin-echo pulse sequence (90-τ-180-τ-Acq) can be acquired. The acquired time-domain NMR signal (as shown in Eq. 10 below) is:

$$M(t) = M_0^{plug} \exp\left(\frac{-2\tau}{T_2^{plug}}\right) \exp\left[\left(i\omega^{plug} - \frac{1}{T_2^{plug}}\right)t\right] + \qquad \text{Eq. 10}$$
$$M_0^{an} \exp\left(\frac{-2\tau}{T_2^{an}}\right) \exp\left[\left(i\omega^{an} - \frac{1}{T_2^{an}}\right)t\right].$$

In Eq. 10, τ is echo time. The corresponding NMR spectrum is then shown in Eq. 11 below:

$$S_{SE}(\omega) = M_0^{plug} \exp\left(\frac{-2\tau}{T_2^{plug}}\right) \frac{1/T_2^{plug}}{(\omega - \omega^{plug})^2 + (1/T_2^{plug})^2} + \qquad \text{Eq. 11}$$
$$M_0^{an} \exp\left(\frac{-2\tau}{T_2^{an}}\right) \exp \frac{1/T_2^{an}}{(\omega - \omega^{an})^2 + (1/T_2^{an})^2}.$$

Figure 5:
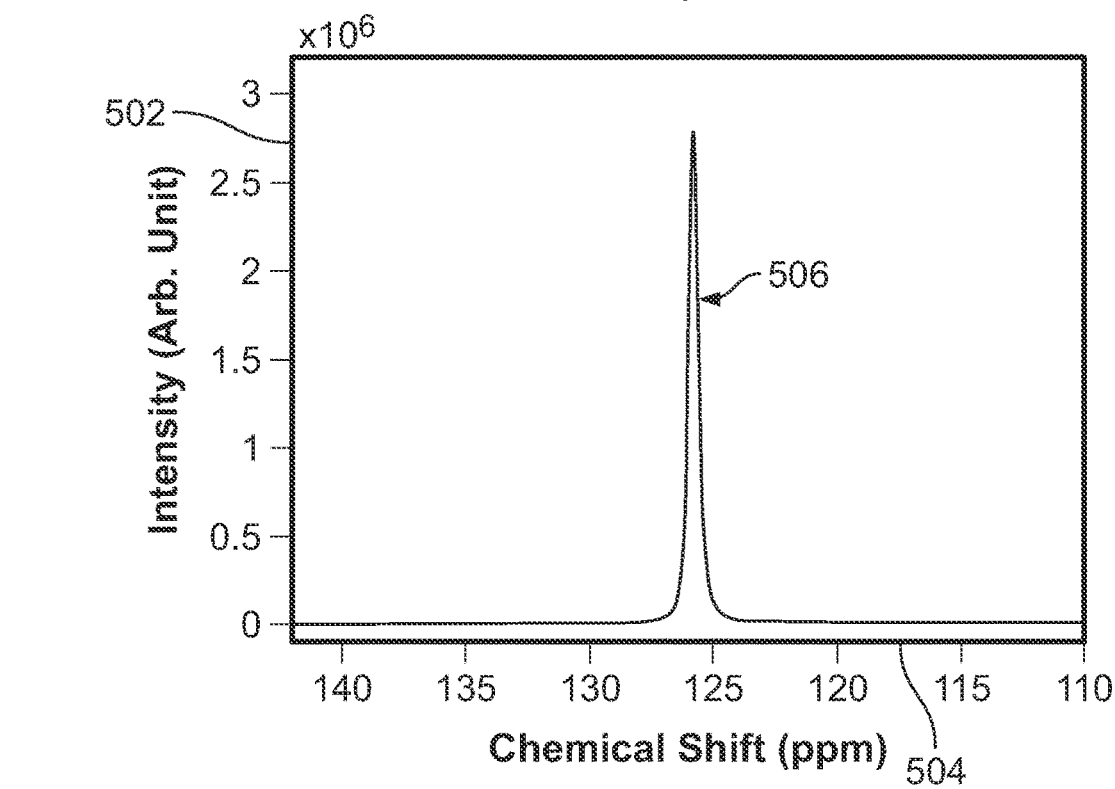

FIG. 5 shows a graph 500 of transverse relaxation time modulated NMR spectrum of the test fluid 111 (in this case, $^{13}C$ labeled $CO_2$) in the core sample 130 and annulus 121 at a high pressure of 4000 psi and a temperature of 40° C. and with a with echo time, τ, of 1.5 ms. Graph 500 includes an x-axis 504 that represents a chemical shift (in parts per million, ppm) while a y-axis 502 represents the intensity of the spectra of fluid in the detection zone of the cylinder 104. In some aspects, the length of echo time, τ, depends on the transverse relaxation time of fluid in the rock, $T_2^{plug}$.

Next, the spectra shown in FIG. 4 and FIG. 5 can be subtracted, which is equivalent to subtracting Eq. 11 from Eq. 8. through $S_{dif}=S(\omega)-S_{SE}(\omega)$, according to:

$$S_{dif}(\omega) = M_0^{plug}\left[1 - \exp\left(\frac{-2\tau}{T_2^{plug}}\right)\right]\frac{1/T_2^{plug}}{(\omega - \omega^{plug})^2 + (1/T_2^{plug})^2} + \quad \text{Eq. 12}$$

$$M_0^{an}\left[1 - \exp(-2\tau/T_2^{an})\right]\exp\frac{1/T_2^{an}}{(\omega - \omega^{an})^2 + (1/T_2^{an})^2}.$$

If $\tau$ is sufficiently large, the signal from within the core sample 130 decays to zero, and Eqs. 11 and 12 become, respectively:

$$S_{SE}(\omega) = M_0^{an}\exp(-2\tau/T_2^{an})\frac{1/T_2^{an}}{(\omega - \omega^{an})^2 + (1/T_2^{an})^2}. \quad \text{Eq. 13}$$

$$S_{dif}(\omega) = M_0^{plug}\frac{1/T_2^{plug}}{(\omega - \omega^{plug})^2 + (1/T_2^{plug})^2} + \quad \text{Eq. 14}$$

$$M_0^{an}\left[1 - \exp(-2\tau/T_2^{an})\right]\frac{1/T_2^{an}}{(\omega - \omega^{an})^2 + (1/T_2^{an})^2}.$$

In this example, $\tau$ is sufficiently large when, for instance, $2\tau$ is larger than $5T_2^{plug}$. In such a situation, the first term of Eq. 12 becomes negligible.

Figure 6:
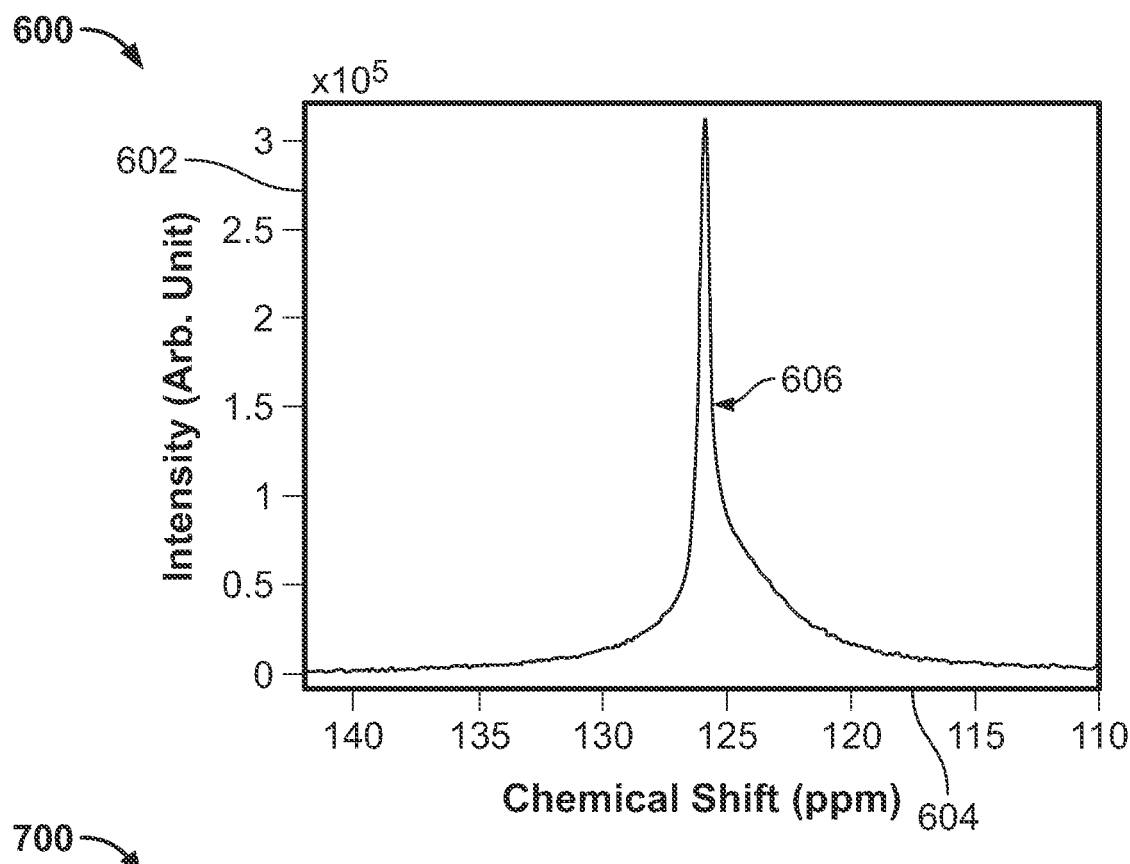

The NMR signal from the annulus 121 is much smaller than or comparable to the signal from the core sample 130, which (at the high pressure) allows for more accurate deconvolution and increased accuracy to obtain the signal from the core sample 130. For instance, FIG. 6 shows a graph 600 of the NMR spectrum difference between curves 406 and 506 (with curve 606). Graph 600 includes an x-axis 604 that represents a chemical shift (in parts per million, ppm) while a y-axis 602 represents the intensity of the spectra of fluid in the detection zone of the cylinder 104. Here, curve 606 represents the difference in NMR spectrum of the two spectra acquired with 900 degree pulse (curve 406 in FIG. 4) and spin echo (curve 506 in FIG. 5).

Subsequent to determining the difference, a deconvolution of the difference spectrum can be performed to obtain $M_0^{plug}$, $\omega^{plug}$, and $T_2^{plug}$. From deconvolution algorithms (for example, as part of the NMR control system 999), the two peaks (of the annulus 121, and core sample 130) in Eq. 14 can be obtained. In some aspects, the determined fluid in the core sample 130 and can be represented by $M_0^{plug}$, $\omega^{plug}$, and $T_2^{plug}$. Using the spectrum integration in Eq. 9, the spin magnetization from the annulus 121, $M_0^{an}$. The obtained $M_0^{plug}$ and $M_0^{an}$ can then be used in Eq. 1 to obtain the total test fluid 111 (for example, $CO_2$) in the core sample 130. For example, deconvolution of Eq. 14 obtains $M_0^{plug}$, $\omega^{plug}$, and $T_2^{plug}$. A subtraction of integration of Eq. 8 by $M_0^{plug}$ then obtains $M_0^{an}$, which in turn provides Eq. 1.

Figure 7:
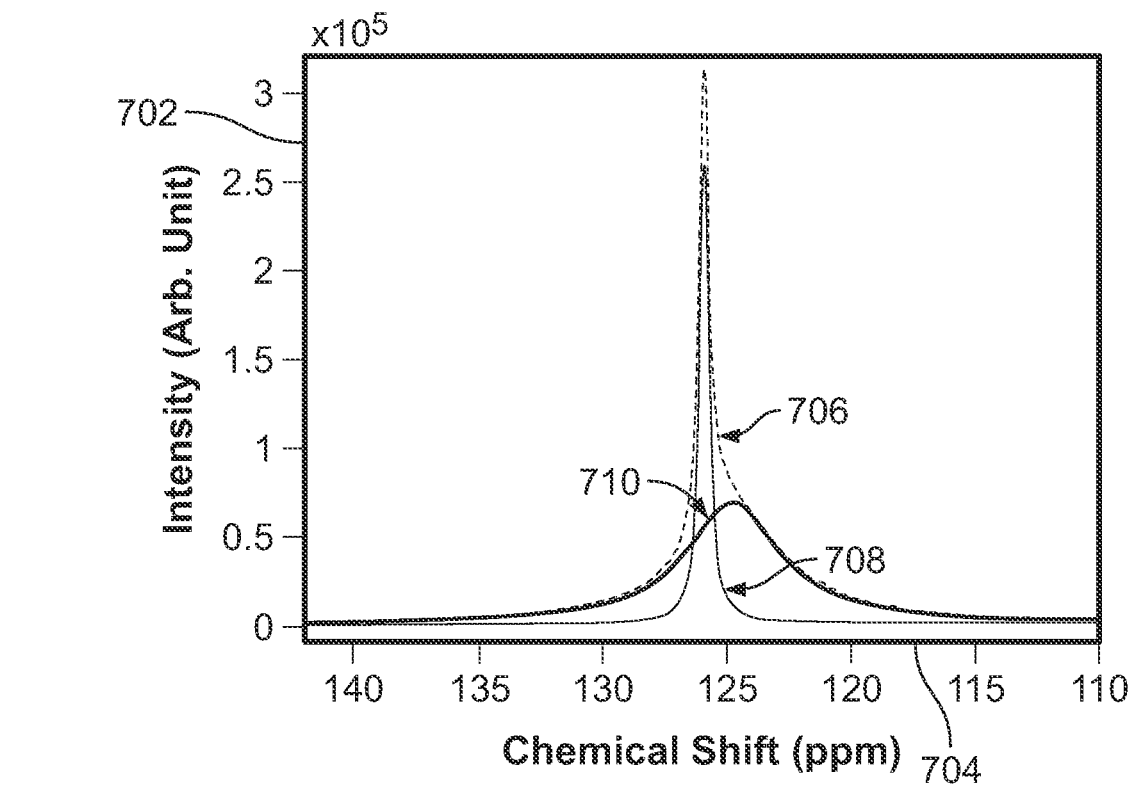

FIG. 7 shows a graph 700 of the deconvolution of the difference spectrum shown in graph 600. Graph 700 includes an x-axis 704 that represents a chemical shift (in parts per million, ppm) while a y-axis 702 represents the intensity of the spectra of fluid in the detection zone of the cylinder 104. Curve 706 is the curve 606 from FIG. 6, curve 708 is the deconvoluted NMR spectrum at the high pressure of test fluid 111 of the core sample 130, and curve 710 is the deconvoluted NMR spectrum at the high pressure of test fluid 111 in the annulus 121. Using the experimental parameters described earlier, the $CO_2$ in the core sample 130 is 22.42 mg/g at 4000 psi and 40° C. (in other words, at a "high pressure").

Figure 8:
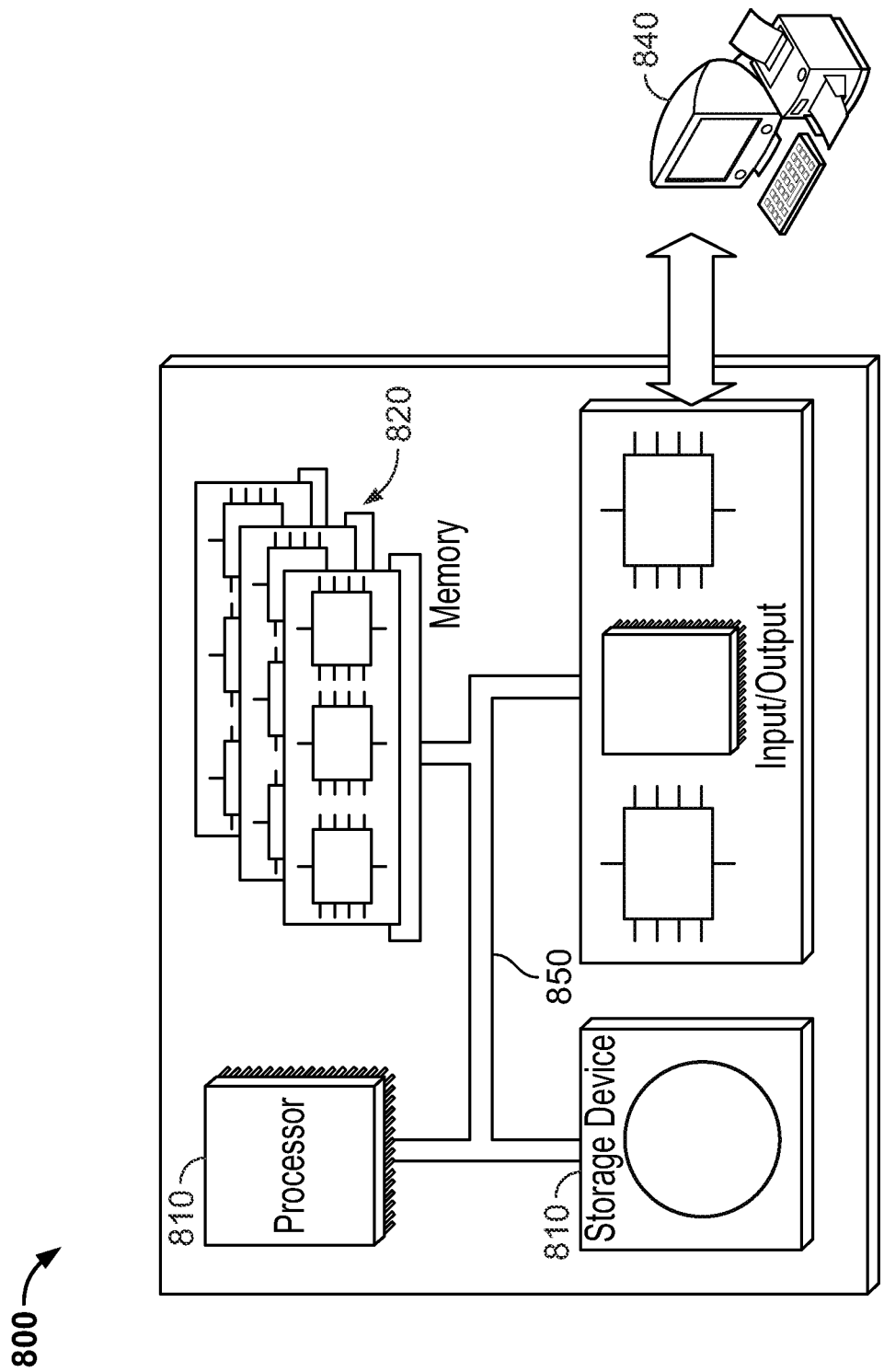
FIG. 8 shows a schematic drawing of a control system that can be used in the example method performed by the system of FIG. 1 for determining an uptake capacity of a rock core sample according to the present disclosure.

FIG. 8 is a schematic illustration of an example control system 800 for a rock property measurement system according to the present disclosure. For example, all or parts of the control system (or controller) 800 can be used for the operations described previously, for example as or as part of the NMR control system 999. The controller 800 is intended to include various forms of digital computers, such as printed circuit boards (PCB), processors, digital circuitry, or otherwise. Additionally, the system can include portable storage media, such as, Universal Serial Bus (USB) flash drives. For example, the USB flash drives may store operating systems and other applications. The USB flash drives can include input/output components, such as a wireless transmitter or USB connector that may be inserted into a USB port of another computing device.

The controller 800 includes a processor 810, a memory 820, a storage device 830, and an input/output device 840. Each of the components 810, 820, 830, and 840 are interconnected using a system bus 850. The processor 810 is capable of processing instructions for execution within the controller 800. The processor may be designed using any of a number of architectures. For example, the processor 810 may be a CISC (Complex Instruction Set Computers) processor, a RISC (Reduced Instruction Set Computer) processor, or a MISC (Minimal Instruction Set Computer) processor.

In one implementation, the processor 810 is a single-threaded processor. In another implementation, the processor 810 is a multi-threaded processor. The processor 810 is capable of processing instructions stored in the memory 820 or on the storage device 830 to display graphical information for a user interface on the input/output device 840.

The memory 820 stores information within the control system 800. In one implementation, the memory 820 is a computer-readable medium. In one implementation, the memory 820 is a volatile memory unit. In another implementation, the memory 820 is a non-volatile memory unit.

The storage device 830 is capable of providing mass storage for the controller 800. In one implementation, the storage device 830 is a computer-readable medium. In various different implementations, the storage device 830 may be a floppy disk device, a hard disk device, an optical disk device, a tape device, flash memory, a solid state device (SSD), or a combination thereof.

The input/output device 840 provides input/output operations for the controller 800. In one implementation, the input/output device 840 includes a keyboard and/or pointing device. In another implementation, the input/output device 840 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, for example, in a machine-readable storage device for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, solid state drives (SSDs), and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) or LED (light-emitting diode) monitor for displaying information to the user and a keyboard and a pointing device such as a mouse or a trackball by which the user can provide input to the computer. Additionally, such activities can be implemented via touchscreen flat-panel displays and other appropriate mechanisms.

The features can be implemented in a control system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include a local area network ("LAN"), a wide area network ("WAN"), peer-to-peer networks (having ad-hoc or static members), grid computing infrastructures, and the Internet.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

A number of implementations have been described. Nevertheless, it will be understood that various modifications may be made without departing from the spirit and scope of the disclosure. For example, example operations, methods, or processes described herein may include more steps or fewer steps than those described. Further, the steps in such example operations, methods, or processes may be performed in different successions than that described or illustrated in the figures. Accordingly, other implementations are within the scope of the following claims.

What is claimed is:

1. A method for determining an uptake capacity of a core sample, comprising:
    measuring a nuclear magnetic resonance (NMR) spectrum signal of a test fluid at a particular pressure and entrained in a core sample enclosed in a test cylinder of an NMR pressure cell such that an annulus is defined between the core sample and the test cylinder;
    deconvolving the NMR spectrum signal into a first NMR spectrum signal portion that is associated with a first portion of the test fluid in the annulus and a second NMR spectrum signal portion that is associated with a second portion of the test fluid entrained in the core sample; and
    determining a mass of the second portion of the test fluid based at least in part on the first and second NMR spectrum signals.

2. The method of claim 1, wherein the particular pressure is less than about 1000 psi.

3. The method of claim 2, further comprising:
    determining a ratio of first and second NMR spin magnetizations from the respective first and second NMR spectrum signals; and
    determining a radial dimension of the test cylinder, a radial dimension of the core sample, a distance between NMR coil contacts of an NMR coil of the NMR pressure cell, a mass of the core sample, and a bulk density of the test fluid.

4. The method of claim 3, wherein determining the ratio of first and second NMR spin magnetizations comprises:
    determining the first NMR spin magnetization by integrating the first NMR spectrum signal; and
    determining the second NMR spin magnetization by integrating the second NMR spectrum signal.

5. The method of claim 3, wherein determining the mass of the second portion of the test fluid based at least in part on the first and second NMR spectrum signals comprises:
    determining the mass of the second portion of the test fluid based on the radial dimension of the test cylinder, the radial dimension of the core sample, a length of the core sample, the bulk density of the test fluid, and the ratio of the first and second NMR spin magnetizations.

6. The method of claim 5, wherein determining the mass of the second portion of the test fluid based on the radial dimension of the test cylinder, the radial dimension of the core sample, a length of the core sample, the bulk density of the test fluid, and the ratio of the first and second NMR spectrum signals comprises solving for:

$$m_{pf} = \pi l \frac{(R^2 - r^2)\rho}{\gamma},$$

where $m_{pf}$ is the mass of the second portion of the test fluid, l is the length of the core sample, R is the radial dimension of the test cylinder, r is the radial dimension of the core sample, $\rho$ is the bulk density of the test fluid, and $\gamma$ is the ratio of the first and second NMR spin magnetizations.

7. The method of claim 5, further comprising determining a test fluid mass per core sample mass by dividing the mass of the second portion of the test fluid by the mass of the core sample.

8. The method of claim 1, wherein the particular pressure is more than about 1000 psi.

9. The method of claim 8, further comprising:
determining a real NMR spectrum of the test fluid in the annulus and the core sample by integrating the NMR spectrum signal over a resonance frequency;
determining a transverse relaxation time modulated NMR spectrum using a spin-echo pulse sequence; and
determining an NMR spectrum difference by subtracting the transverse relaxation time modulated NMR spectrum from the real NMR spectrum.

10. The method of claim 9, wherein deconvolving the NMR spectrum signal into the first NMR spectrum signal portion that is associated with the first portion of the test fluid in the annulus and the second NMR spectrum signal portion that is associated with the second portion of the test fluid entrained in the core sample comprises:
deconvolving the NMR spectrum difference into the first NMR spectrum signal portion and the second NMR spectrum signal portion.

11. The method of claim 10, further comprising:
determining a ratio of first and second NMR spin magnetizations from the respective first and second NMR spectrum signals; and
determining a radial dimension of the test cylinder, a radial dimension of the core sample, a distance between NMR coil contacts of an NMR coil of the NMR pressure cell, a mass of the core sample, and a bulk density of the test fluid.

12. The method of claim 11, wherein determining the ratio of first and second NMR spin magnetizations comprises:
determining the first NMR spin magnetization by integrating the first NMR spectrum signal; and
determining the second NMR spin magnetization by integrating the second NMR spectrum signal.

13. The method of claim 11, wherein determining the mass of the second portion of the test fluid based at least in part on the first and second NMR spectrum signals comprises:
determining the mass of the second portion of the test fluid based on the radial dimension of the test cylinder, the radial dimension of the core sample, a length of the core sample, the bulk density of the test fluid, and the ratio of the first and second NMR spectrum signals.

14. The method of claim 13, wherein determining the mass of the second portion of the test fluid based on the radial dimension of the test cylinder, the radial dimension of the core sample, a length of the core sample, the bulk density of the test fluid, and the ratio of the first and second NMR spectrum signals comprises solving for:

$$m_{pf} = \pi l \frac{(R^2 - r^2)\rho}{\gamma},$$

where $m_{pf}$ is the mass of the second portion of the test fluid, l is the length of the core sample, R is the radial dimension of the test cylinder, r is the radial dimension of the core sample, $\rho$ is the bulk density of the test fluid, and $\gamma$ is the ratio of the first and second NMR spin magnetizations.

15. The method of claim 13, further comprising determining a test fluid mass per core sample mass by dividing the mass of the second portion of the test fluid by the mass of the core sample.

16. The method of claim 1, wherein the test fluid comprises carbon dioxide ($CO_2$).

17. The method of claim 16, wherein the $CO_2$ comprises $^{13}C$ labeled $CO_2$.

18. A system for determining an uptake capacity of a core sample, comprising:
a nuclear magnetic resonance (NMR) pressure cell, comprising:
a test cylinder configured to hold a test fluid and a core sample; and
an NMR coil positioned around the test cylinder and configured to measure NMR spectrum signals of the test cylinder;
a control system communicably coupled to the NMR coil and configured to perform operations comprising:
measuring a nuclear magnetic resonance (NMR) spectrum signal of a test fluid at a particular pressure and entrained in a core sample enclosed in a test cylinder of an NMR pressure cell such that an annulus is defined between the core sample and the test cylinder;
deconvolving the NMR spectrum signal into a first NMR spectrum signal portion that is associated with a first portion of the test fluid in the annulus and a second NMR spectrum signal portion that is associated with a second portion of the test fluid entrained in the core sample; and
determining a mass of the second portion of the test fluid based at least in part on the first and second NMR spectrum signals.

19. The system of claim 18, wherein the particular pressure is less than about 1000 psi.

20. The system of claim 19, wherein the operations further comprise:
determining a ratio of first and second NMR spin magnetizations from the respective first and second NMR spectrum signals; and
determining a radial dimension of the test cylinder, a radial dimension of the core sample, a distance between NMR coil contacts of an NMR coil of the NMR pressure cell, a mass of the core sample, and a bulk density of the test fluid.

21. The system of claim 20, wherein the operation of determining the ratio of first and second NMR spin magnetizations comprises:

determining the first NMR spin magnetization by integrating the first NMR spectrum signal; and determining the second NMR spin magnetization by integrating the second NMR spectrum signal.

22. The system of claim 20, wherein the operation of determining the mass of the second portion of the test fluid based at least in part on the first and second NMR spectrum signals comprises:

determining the mass of the second portion of the test fluid based on the radial dimension of the test cylinder, the radial dimension of the core sample, a length of the core sample, the bulk density of the test fluid, and the ratio of the first and second NMR spin magnetizations.

23. The system of claim 22, wherein the operation of determining the mass of the second portion of the test fluid based on the radial dimension of the test cylinder, the radial dimension of the core sample, a length of the core sample, the bulk density of the test fluid, and the ratio of the first and second NMR spectrum signals comprises solving for:

$$m_{pf} = \pi l \frac{(R^2 - r^2)\rho}{\gamma},$$

where $m_{pf}$ is the mass of the second portion of the test fluid, l is the length of the core sample, R is the radial dimension of the test cylinder, r is the radial dimension of the core sample, $\rho$ is the bulk density of the test fluid, and $\gamma$ is the ratio of the first and second NMR spin magnetizations.

24. The system of claim 22, wherein the operations further comprise determining a test fluid mass per core sample mass by dividing the mass of the second portion of the test fluid by the mass of the core sample.

25. The system of claim 18, wherein the particular pressure is more than about 1000 psi.

26. The system of claim 25, wherein the operations further comprise:

determining a real NMR spectrum of the test fluid in the annulus and the core sample by integrating the NMR spectrum signal over a resonance frequency;

determining a transverse relaxation time modulated NMR spectrum using a spin-echo pulse sequence; and determining an NMR spectrum difference by subtracting the transverse relaxation time modulated NMR spectrum from the real NMR spectrum.

27. The system of claim 26, wherein the operation of deconvolving the NMR spectrum signal into the first NMR spectrum signal portion that is associated with the first portion of the test fluid in the annulus and the second NMR spectrum signal portion that is associated with the second portion of the test fluid entrained in the core sample comprises:

deconvolving the NMR spectrum difference into the first NMR spectrum signal portion and the second NMR spectrum signal portion.

28. The system of claim 27, wherein the operations further comprise:

determining a ratio of first and second NMR spin magnetizations from the respective first and second NMR spectrum signals; and determining a radial dimension of the test cylinder, a radial dimension of the core sample, a distance between NMR coil contacts of an NMR coil of the NMR pressure cell, a mass of the core sample, and a bulk density of the test fluid.

29. The system of claim 28, wherein the operation of determining the ratio of first and second NMR spin magnetizations comprises:

determining the first NMR spin magnetization by integrating the first NMR spectrum signal; and determining the second NMR spin magnetization by integrating the second NMR spectrum signal.

30. The system of claim 28, wherein the operation of determining the mass of the second portion of the test fluid based at least in part on the first and second NMR spectrum signals comprises:

determining the mass of the second portion of the test fluid based on the radial dimension of the test cylinder, the radial dimension of the core sample, a length of the core sample, the bulk density of the test fluid, and the ratio of the first and second NMR spin magnetizations.

31. The system of claim 30, wherein the operation of determining the mass of the second portion of the test fluid based on the radial dimension of the test cylinder, the radial dimension of the core sample, a length of the core sample, the bulk density of the test fluid, and the ratio of the first and second NMR spectrum signals comprises solving for:

$$m_{pf} = \pi l \frac{(R^2 - r^2)\rho}{\gamma},$$

where $m_{pf}$ is the mass of the second portion of the test fluid, l is the length of the core sample, R is the radial dimension of the test cylinder, r is the radial dimension of the core sample, $\rho$ is the bulk density of the test fluid, and $\gamma$ is the ratio of the first and second NMR spin magnetizations.

32. The system of claim 30, wherein the operations further comprise determining a test fluid mass per core sample mass by dividing the mass of the second portion of the test fluid by the mass of the core sample.

33. The system of claim 18, wherein the test fluid comprises carbon dioxide ($CO_2$).

34. The system of claim 33, wherein the $CO_2$ comprises $^{13}C$ labeled $CO_2$.

* * * * *